(12) United States Patent
Jin et al.

(10) Patent No.: US 7,919,786 B2
(45) Date of Patent: *Apr. 5, 2011

(54) NANOWIRE LIGHT EMITTING DEVICE

(75) Inventors: Young-gu Jin, Hwaseong-si (KR);
Sung-hoon Lee, Yongin-si (KR);
Hyo-sug Lee, Suwon-si (KR);
Byoung-lyong Choi, Seoul (KR);
Jong-seob Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 387 days.

This patent is subject to a terminal disclaimer.

(21) Appl. No.: 12/040,686

(22) Filed: Feb. 29, 2008

(65) Prior Publication Data
US 2009/0008664 A1 Jan. 8, 2009

Related U.S. Application Data

(62) Division of application No. 11/100,455, filed on Apr. 7, 2005, now abandoned.

(30) Foreign Application Priority Data

Apr. 7, 2004 (KR) .................. 10-2004-0023805

(51) Int. Cl.
*H01L 33/00* (2010.01)
(52) U.S. Cl. ............... 257/98; 257/97; 257/88; 257/40; 257/E33.001; 977/762
(58) Field of Classification Search .............. 257/40, 257/88, 98, E33.001
See application file for complete search history.

(56) References Cited

U.S. PATENT DOCUMENTS

| 3,971,870 | A | 7/1976 | Christensen et al. |
| 5,075,743 | A | 12/1991 | Behfar-Rad |
| 5,332,910 | A | 7/1994 | Haraguchi et al. |
| 6,996,147 | B2 | 2/2006 | Majumdar et al. |
| 7,176,623 | B2 | 2/2007 | Nitta et al. |
| 7,254,151 | B2 | 8/2007 | Lieber et al. |
| 7,435,996 | B2 * | 10/2008 | Jin et al. ............... 257/88 |
| 7,453,097 | B2 * | 11/2008 | Jin et al. ............... 257/88 |

(Continued)

FOREIGN PATENT DOCUMENTS

| CN | 1447629 A | 10/2003 |
| CN | 1453884 A | 11/2003 |
| JP | 6-260721 A | 9/1994 |
| JP | 10-326888 A | 12/1998 |
| KP | 2004-418 A | 1/2004 |

OTHER PUBLICATIONS

Ng. Kwok K. "Complete Guide To Semiconductor Devices" $2^{nd}$ Ed. Wiley-Interscience: New York. (2002) pp. 405-406.

(Continued)

*Primary Examiner* — Thinh T Nguyen
(74) *Attorney, Agent, or Firm* — Sughrue Mion, PLLC

(57) ABSTRACT

A nanowire light emitting device is provided. The nanowire light emitting device includes a substrate, a first conductive layer formed on the substrate, a plurality of nanowires vertically formed on the first conductive layer, each nanowire comprising a p-doped portion and an n-doped portion, a light emitting layer between the p-doped portion and the n-doped portion, a second conductive layer formed on the nanowires, and an insulating polymer in which a light emitting material is embedded, filling a space between the nanowires. The color of light emitted from the light emitting layer varies according to the light emitting material.

12 Claims, 2 Drawing Sheets

U.S. PATENT DOCUMENTS

| | | |
|---|---|---|
| 2001/0054709 A1 | 12/2001 | Heath et al. |
| 2002/0172820 A1 | 11/2002 | Majumdar et al. |
| 2002/0175408 A1 | 11/2002 | Majumdar et al. |
| 2003/0168964 A1 | 9/2003 | Chen |
| 2004/0003839 A1 | 1/2004 | Curtin |
| 2004/0086743 A1 | 5/2004 | Brown et al. |
| 2004/0105810 A1 | 6/2004 | Ren et al. |
| 2004/0109666 A1 | 6/2004 | Kim |
| 2005/0006673 A1 | 1/2005 | Samuelson et al. |
| 2005/0224790 A1 | 10/2005 | Jin et al. |
| 2005/0227391 A1 | 10/2005 | Jin et al. |
| 2006/0207647 A1 | 9/2006 | Tsakalakos et al. |

OTHER PUBLICATIONS

Nollau, A., et al. "Controlled n-Type Doping of a Molecular Organic Semiconductor: Naphthalenetetracarboxylic dianhydride (NTCDA) Doped With Bis (ethylenedithio)-tetrathiafulvalene (BEDT-TFF)" J. Appl.Phys. vol. 87 (2000): pp. 4340-4343.

Guk, E. G., et al. "Dopant Impurity Diffusion From Polymer Diffusants and its Applications in Semiconductor Device Technology. A Review." Semiconductors. vol. 33 (1999): pp. 265-275.

* cited by examiner

NANOWIRE LIGHT EMITTING DEVICE

This application claims priority from Korean Patent Application No. 10-2004-0023805, filed on Apr. 7, 2004, in the Korean Intellectual Property Office. This application is also a divisional of U.S. application Ser. No. 11/100,455 filed Apr. 7, 2005 now abandoned. The entire disclosures of Korean Patent Application No. 10-2004-0023805 and U.S. application Ser. No. 11/100,455 are incorporated herein in their entirety by reference.

BACKGROUND OF THE INVENTION

1. Field of the Invention

The present invention relates to a nanowire light emitting device, and more particularly, to a nanowire light emitting device in which a light emitting material is formed to convert light emitted by nanowires into different light.

2. Description of the Related Art

A light emitting diode (LED) using a gallium nitride (GaN) semiconductor is under study. Although the GaN-based LED has high light emitting efficiency, it has a mismatch problem with a substrate, thus making it difficult to produce a large-sized device.

Technology in which a light emitting device uses a nanostructure such as a nanowire is being developed. Japanese Patent Laid-Open Publication No. Hei 10-326888 discloses a light emitting device comprising a nanowire composed of silicon and a method of fabricating the light emitting device. After a catalytic layer such as gold is deposited on a substrate, the silicon nanowire is grown from the catalytic layer by flowing silicon tetrachloride (SiCl4) gas into a reactor. In the light emitting device, emitting colors are controlled by controlling a diameter of the nanowires.

The silicon nanowire light emitting device, although being manufactured at a low cost, has a low light emitting efficiency.

U.S. Patent Publication No. 2003/0168964 discloses a nanowire light emitting device having a p-n diode structure. In this case, the lower portion of the nanowire is an n-type nanowire and the upper portion is a p-type nanowire, and light is emitted from the junction region between the two portions. Other components are added using a vapor phase-liquid phase-solid phase (VLS) method in order to fabricate a nanowire light emitting device having the p-n junction structure. In the light emitting device of the U.S. Patent Publication, a predetermined fluorescent material is disposed on a transparent substrate in order to provide a visible ray of a desired color.

As the nanowire having the p-n junction structure is grown on a catalytic layer, the n-type nanowire and the p-type nanowire are sequentially formed, thus making it difficult to obtain a high quality p-n junction structure.

SUMMARY OF THE INVENTION

The present invention provides a light emitting device, including a material emitting a predetermined color filling a space between nanowires.

According to an aspect of the present invention, there is provided a nanowire light emitting device comprising: a substrate; a first conductive layer formed on the substrate; a plurality of nanowires vertically formed on the first conductive layer, each nanowire comprising a p-doped portion and an n-doped portion; a light emitting layer between the p-doped portion and the n-doped portion; a second conductive layer formed on the nanowires; and an insulating polymer in which a light emitting material is embedded, filling a space between the nanowires, wherein a color of light emitted from the light emitting layer varies according to the light emitting material.

The p-doped portion and n-doped portion may be doped with dopant atoms when the nanowires are grown or may be formed by adsorbing organic molecules onto the surfaces of the nanowires. The light emitting layer may be a contact boundary between the p-doped portion and the n-doped portion. The light emitting layer may be an undoped intrinsic portion formed between the p-doped portion and the n-doped portion.

The light emitting material may be a fluorescent material. Alternatively, light emitting material may be a dye or a quantum dot.

The insulating polymer in which the light emitting material is embedded may be a colloidal quantum dot. The nanowire light emitting device may further comprise a reflective layer that reflects light emitted from the nanowires.

The reflective layer may be disposed below the first conductive layer and the substrate, and the first conductive layer may be composed of a light transmitting material. Alternatively, the reflective layer may be disposed on the second conductive layer, and the second conductive layer may be a transparent electrode.

The n-doped portion may be a portion of the nanowires where molecules having a low ionization potential are adsorbed on the surface of the nanowires.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

A nanowire light emitting device according to the present invention will become more apparent by describing in detail exemplary embodiments thereof with reference to the attached drawings.

Figure 1:
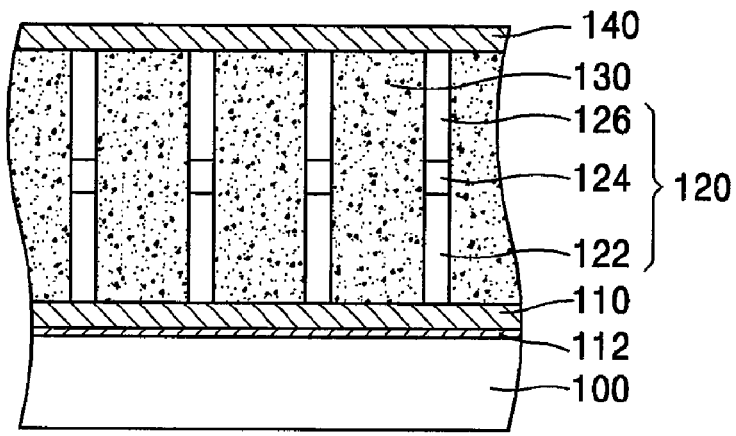
FIG. 1 is a cross-sectional view of a nanowire light emitting device according to a first exemplary embodiment of the present invention.

FIG. 1 is a cross-sectional view of a nanowire light emitting device according to a first embodiment of the present invention.

Referring to FIG. 1, a conductive layer (a first electrode layer) 110 is formed on a substrate 100 and a plurality of nanowires 120 are formed roughly at right angles to the conductive layer 110. An insulating polymer 130, in which a light emitting material is embedded, fills a space between the nanowires 120. An electrode layer (a second electrode layer) 140 is formed on the nanowires 120.

The nanowires 120 each have a p-type doped portion 122, an n-type doped portion 126 and an intrinsic portion 124, which is a light emitting layer between the p-type doped portion 122 and the n-type doped portion 126. The intrinsic portion 124 is not doped.

The substrate 100 may be a silicon wafer, a sapphire wafer, or a flat metal film. If light is to be transmitted toward the substrate 100, the substrate 100 may be a transparent substrate such as a sapphire substrate, a quartz substrate, or a glass substrate.

The first electrode layer 110 may be a transparent electrode layer, for example, an ITO layer. The second electrode layer 140 may be formed of aluminum, gold, or magnesium by deposition. If light is transmitted through the second electrode layer 140, the second electrode layer 140 may be a transparent electrode layer such as an ITO layer.

The nanowires 120 may emit ultraviolet light or blue light. When the nanowires 120 are composed of ZnO, ultraviolet light is emitted. When the nanowires are composed of Si, infrared light is emitted. When the nanowires are composed of GaN, ultraviolet light or blue light is emitted. When the nanowires are composed of InGaN, blue light is emitted. The nanowires 120 may have a diameter of 20-100 nm and a length of 1 μm.

The nanowires have a p-i-n junction structure comprising the p-doped portion 122, the n-doped portion 126, and the intrinsic portion 124.

The p-type doped portion 122 is a portion formed by adsorbing a p-type dopant into the surface of the nanowires 120. A molecule having a high electron affinity such as tetrafluoro-tetracyano-quinodimethane (F4-TCNQ), which is an organic electron acceptor molecule, may be used as the p-type dopant. Because the p-type dopant takes electrons from the corresponding surfaces of the nanowires 120, holes are formed on the surfaces of the nanowires where the p-type dopant is adsorbed. Thus, the p-type doped portion 122 is formed. The p-type doped portion 122 may contain electron acceptor atoms therein.

The n-type doped portion 126 is a portion formed by adsorbing an n-type dopant onto the surface of the nanowires 120. Molecules having a low ionization potential such as an organic electron donor molecule or a molecule containing at least one of lithium, copper, and zinc may be used as the n-type dopant. For example, copper phthalocyanine (CuPc), zinc phthalocyanine (ZnPc), pentacene, or bis(ethylenddithio)tetrathiafulvalene (BEDT-TTF) may be used for the n-type dopant. Because the n-type dopant provides electrons to the corresponding surfaces of the nanowires 120, free electrons are generated on the surfaces of the nanowires where the n-type dopant is adsorbed. Thus, the n-type doped portion 126 is formed. The n-type doped portion 126 may contain electron donor atoms therein.

The insulating polymer 130 prevents electric contact between the nanowires 120. A fluorescent material is embedded inside the insulating polymer 130 such that ultraviolet light emitted from the nanowires 120 can be adsorbed onto the fluorescent material and a predetermined visible wavelength can be emitted from the fluorescent material. The polymer 130 may also be an insulating polymer in which a dye or quantum dot is embedded. Most semiconductor compounds, for example ZnS, CdS, ZnSe, CdSe, and InP, may be used as the quantum dot. A photoresist can be the insulating polymer 130 containing the fluorescent material, dye, or quantum dot.

Ultraviolet light emitted from the nanowires 120 is adsorbed by the fluorescent material, dye, or quantum dot that is embedded in the insulating layer 130. The fluorescent material, dye, or quantum dot that adsorbs the ultraviolet emits a predetermined color.

A visible ray emitted from the fluorescent material, dye, or quantum dot varies according to the fluorescent material, the color of the dye, or the size of the quantum dot.

Figure 2:
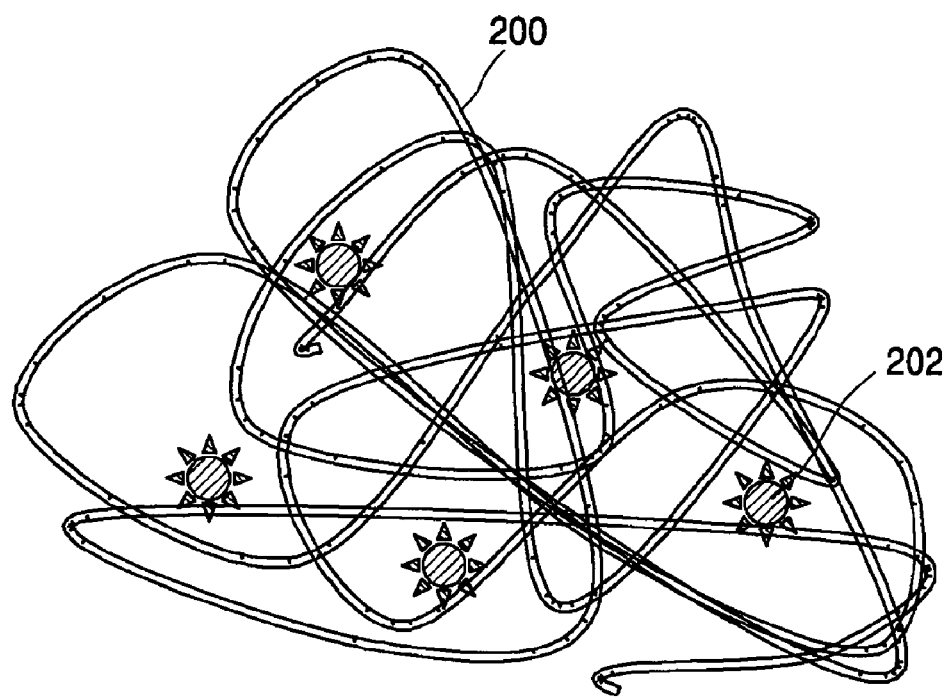
FIG. 2 is a diagram illustrating how a fluorescent material, dye, or quantum dot, which is a light emitting material, is embedded in the insulating polymer.

FIG. 2 is a diagram illustrating how a fluorescent material, dye, or quantum dot, which is a light emitting material, is embedded in the insulating polymer. A plurality of quantum dots 202 are embedded in the insulating polymer 200.

Figure 3:
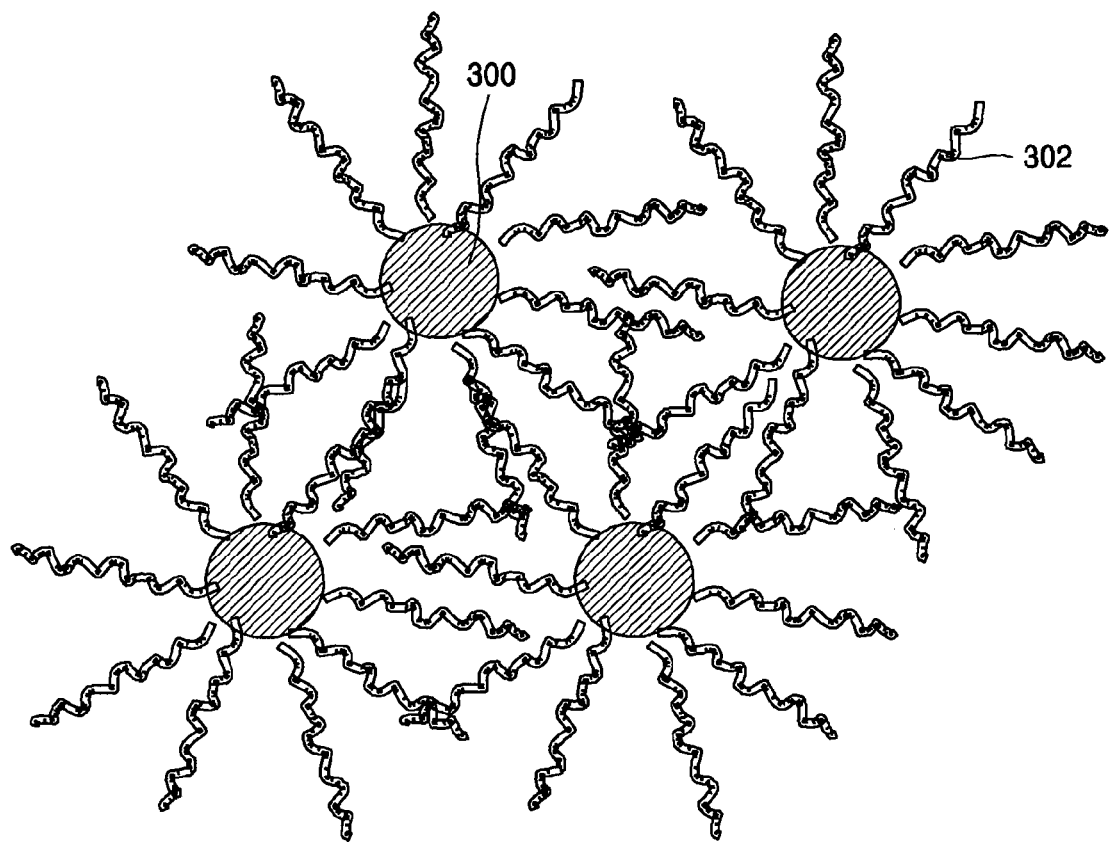
FIG. 3 is a diagram illustrating colloidal quantum dots in which organic molecule chains are attached thereto.

FIG. 3 is a diagram illustrating colloidal quantum dots in which organic molecule chains 302 are attached to the quantum dots 300. Instead of using the polymer in which a fluorescent material, a dye, or a quantum dot is embedded, the colloidal quantum dots of FIG. 3 may be used by stacking them between the nanowires 120. The organic molecule chain 302 may be composed of a material such as trioctylphospine oxide (TOPO) or 1.6-hexanedithiol (HDT).

A reflective layer 112 may be interposed between the substrate 100 and the first electrode layer 110. A long-wave pass filter can be used as the reflective layer 112. When the reflective layer 112 has a thickness equal to the wavelength of light emitted from the nanowires 120, for example, the wavelength of ultraviolet light, the reflective layer 112 reflects the ultraviolet light, which is emitted from the intrinsic portion 124 of the nanowires 120, back inside the light emitting device and transmits only visible rays to the outside. Therefore, the reflective layer 112 contributes all the ultraviolet light emitted from the nanowires 120 to emit visible rays, thus improving light emitting efficiency.

The reflective layer 112 does not have to be disposed below the first electrode layer 110. That is, the reflective layer 112 may be disposed above the first electrode layer 110 when the reflective layer 112 is conductive. If the light of the light emitting device is emitted through the second electrode layer 140, the second electrode layer 140 may be composed of a transparent electrode and the reflective layer 120 may be disposed on the second electrode layer 140.

The operation of a light emitting device having the above structure will be now described with reference to the attached drawings.

First, holes from the p-type doped portion 122 and the electrons from the n-type doped portion 126 combine in the intrinsic portion 124 when a positive voltage is applied to the first electrode layer 110 connected to the p-type doped portion 122 of the nanowires 120 and a negative voltage is applied to the second electrode layer 140 connected to the n-type doped portion 126 of the nanowires 120, thus emitting light. The ultraviolet light emitted from the intrinsic portion 124 disperses in every direction. Some of the ultraviolet light that meets nearby fluorescent material embedded in the insulating polymer 130 excites the fluorescent material, which then emits visible rays. The visible rays are transmitted through the transparent first electrode layer 110, the reflective layer 112, and the transparent substrate 100.

Some of the ultraviolet light emitted from the nanowires 120 that goes towards the second electrode layer 140 is reflected by the second electrode layer 140, back into the light emitting device, and adsorbed by the fluorescent material, which emits visible rays. The ultraviolet light heading towards the first electrode layer 110 is reflected by the reflective layer 112 into the polymer containing the fluorescent material, and excites the fluorescent material.

Figure 4:
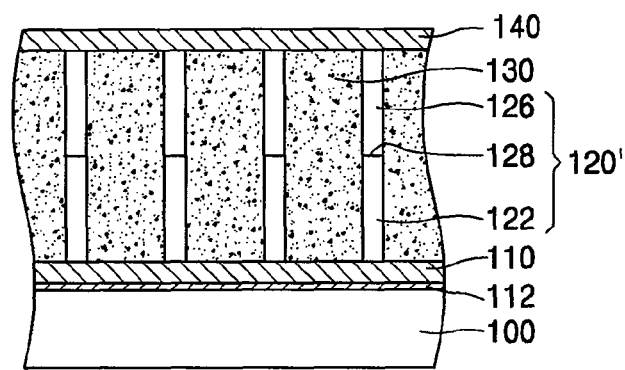
FIG. 4 is a cross-sectional diagram of a nanowire light emitting device according to a second exemplary embodiment of the present invention.

FIG. 4 is a cross-sectional view of a nanowire light emitting device according to a second exemplary embodiment of the present invention. Like reference numerals in FIGS. 1 and 2 denote like elements, and their description will not be repeated.

Referring to FIG. 4, a conductive layer (a first electrode layer) 110 is formed on a substrate 100 and a plurality of nanowires 120' are formed roughly at right angles to the conductive layer 110. An insulating polymer 130 in which a light emitting material is embedded fills a space between the nanowires 120'. An electrode layer (a second electrode layer) 140 is formed on the nanowires 120'.

A reflective layer 112 may be interposed between the substrate 100 and the first electrode layer 110. A long-wave pass filter can be used as the reflective layer 112. When the reflective layer 112 has a thickness equal to the wavelength of light emitted from the nanowires 120', for example, the wavelength of ultraviolet light, the reflective layer 112 reflects the ultraviolet light, which is emitted from a light emitting layer 128 of the nanowires 120', back inside the light emitting device and transmits only visible rays to the outside. Therefore, the reflective layer 112 contributes all the ultraviolet light emitted from the nanowires 120' to emit visible rays, thus improving light emitting efficiency.

The nanowires 120' include a p-type doped portion 122 and an n-type doped portion 126 contacting each other. A contact boundary of the two doped portions 122 and 126 forms a light emitting layer 128. Such a light emitting structure is a p-n junction structure, in comparison to the p-i-n junction structure of the first exemplary embodiment.

The insulating polymer 130 prevents electric contact between the nanowires 120'. A fluorescent material is embedded inside the insulating polymer 130 such that ultraviolet light emitted from the nanowires 120' can be adsorbed onto the fluorescent material and a predetermined visible wavelength can be emitted from the fluorescent material. The polymer 130 may also be an insulating polymer in which a dye or quantum dot is embedded. Most semiconductor compounds, for example ZnS, CdS, ZnSe, CdSe, and InP, may be used as the quantum dot. A photoresist can be the insulating polymer 130 containing the fluorescent material, dye, or quantum dot.

Ultraviolet light emitted from the nanowires 120' is adsorbed by the fluorescent material, dye, or quantum dot that is embedded in the insulating layer 130. The fluorescent material, dye, or quantum dot that adsorbs the ultraviolet emits a predetermined color.

Ultraviolet light is emitted from the light emitting layer 128 when a direct current is supplied to both ends of the nanowires 220'. The ultraviolet light excites the fluorescent material, dye, or quantum dot embedded in the polymer 130 and emits a predetermined visible ray.

In the nanowire light emitting device according to exemplary embodiments of the present invention, the colors of visible rays emitted from a predetermined region can be controlled by controlling the kind or size of a fluorescent material, dye, or quantum dot inside an insulating layer. Also, the efficiency of producing colored light is improved by inserting into the light emitting device a material that controls colors.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nanowire light emitting device comprising:
a substrate;
a first conductive layer disposed on the substrate;
a plurality of nanowires vertically disposed on the first conductive layer, each nanowire comprising a p-doped portion and an n-doped portion;
a light emitting layer between the p-doped portion and the n-doped portion;
a second conductive layer disposed on the nanowires; and
an insulating polymer in which a light emitting material is embedded, filling a space between the nanowires,
wherein a color of light emitted from the light emitting layer varies according to the light emitting material,
wherein the p-doped portion of the nanowires comprises a first plurality of molecules having a high electron affinity which are adsorbed on the p-doped portion, wherein the first plurality of the molecules comprise fluorine, and
wherein the n-doped portion of the nanowires comprises a second plurality of molecules having a low ionization potential which are adsorbed on the n-doped portion, wherein the second plurality of the molecules comprise organic electron donor molecules or molecules containing at least one metal selected from the group consisting of lithium, copper, and zinc.

2. The device of claim 1, wherein the light emitting layer comprises a contact boundary between the p-doped portion and the n-doped portion.

3. The device of claim 1, wherein the light emitting layer comprises an undoped intrinsic portion disposed between the p-doped portion and the n-doped portion.

4. The device of claim 1, wherein the light emitting material comprises a fluorescent material.

5. The device of claim 1, wherein the light emitting material comprises a dye.

6. The device of claim 1, wherein the light emitting material comprises a quantum dot.

7. The device of claim 1, wherein the insulating polymer in which the embedded light emitting material comprises a colloidal quantum dot.

8. The device of claim 1, further comprising a reflective layer that reflects light emitted from the nanowires.

9. The device of claim 8, wherein the reflective layer is disposed below the first conductive layer, and the substrate and the first conductive layer are light transmitting materials.

10. The device of claim 8, wherein the reflective layer is disposed on the second conductive layer, and the second conductive layer is a transparent electrode.

11. The device of claim 1, wherein the molecules containing fluorine are tetrafluoro-tetracyano-quinodimethane (F4-TCNQ).

12. The device of claim 1, wherein the n-doped portion is a portion of the nanowires where at least one material selected from the group consisting of copper phthalocyanine (CuPc), zinc phthalocyanine (ZnPc), pentacene, and bis(ethylenddithio)tetrathiafulvalene (BEDT-TTF) is adsorbed.

* * * * *